United States Patent
Yang et al.

(10) Patent No.: US 8,294,039 B2
(45) Date of Patent: Oct. 23, 2012

(54) SURFACE FINISH STRUCTURE OF MULTI-LAYER SUBSTRATE AND MANUFACTURING METHOD THEREOF

(75) Inventors: Chih-kuang Yang, Hsin-Chu (TW); Chieh-lin Hsing, Taipei (TW)

(73) Assignee: Princo Middle East FZE, Jebel, Ali, Dubai (AE)

( * ) Notice: Subject to any disclaimer, the term of this patent is extended or adjusted under 35 U.S.C. 154(b) by 1294 days.

(21) Appl. No.: 11/950,816

(22) Filed: Dec. 5, 2007

(65) Prior Publication Data
US 2008/0289863 A1 Nov. 27, 2008

(30) Foreign Application Priority Data
May 25, 2007 (TW) .................. 96118768 A

(51) Int. Cl.
H05K 1/11 (2006.01)
H05K 3/36 (2006.01)
(52) U.S. Cl. .......................... 174/261; 29/830
(58) Field of Classification Search .................. 174/261; 361/767–774; 29/830, 840
See application file for complete search history.

(56) References Cited

U.S. PATENT DOCUMENTS

| | | | |
|---|---|---|---|
| 2,984,595 A | 5/1961 | Schumpelt et al. | |
| 5,445,311 A | 8/1995 | Trask et al. | |
| 5,446,247 A | 8/1995 | Lubomir et al. | |
| 6,192,581 B1 | 2/2001 | Tsukamoto | |
| 6,940,179 B2 | 9/2005 | Lee | |
| 7,012,019 B2 | 3/2006 | Hsu et al. | |
| 7,098,407 B2 | 8/2006 | Kim et al. | |
| 7,342,804 B2 * | 3/2008 | Langhorn et al. | 361/766 |
| 7,538,440 B2 * | 5/2009 | Amir et al. | 257/778 |
| 2002/0121709 A1 * | 9/2002 | Matsuki et al. | 257/786 |
| 2003/0025202 A1 * | 2/2003 | Mikagi et al. | 257/737 |
| 2004/0099961 A1 | 5/2004 | Chu et al. | |
| 2005/0104210 A1 | 5/2005 | Farnworth et al. | |
| 2006/0049516 A1 | 3/2006 | Wang et al. | |
| 2006/0151877 A1 | 7/2006 | Yamashita et al. | |
| 2007/0114674 A1 | 5/2007 | Brown | |

FOREIGN PATENT DOCUMENTS

| | | |
|---|---|---|
| CN | 1476289 | 2/2004 |
| CN | 1747155 | 3/2006 |
| CN | 1930672 | 3/2007 |
| JP | 7193346 | 7/1995 |
| JP | 2004-063929 | 2/2004 |
| TW | 569360 | 1/2004 |
| TW | I245597 | 12/2005 |

* cited by examiner

*Primary Examiner* — Jeremy Norris

(57) ABSTRACT

A surface finish structure of multi-layer substrate and manufacturing method thereof. The surface finish structure of the present invention includes a bond pad layer, at least one cover metal layer and a solder mask. The cover metal layer covers the bond pad layer. The solder mask has a hole to expose the cover metal layer. The present invention can form the cover metal layer to cover the bond pad layer and then forms the solder mask. Thereafter, the hole is made to the solder mask at the position of the cover metal layer to expose thereof. Because the bond pad layer is embedded in a dielectric layer of the multi-layer substrate, adhesion intensity between the bond pad layer and the dielectric layer can be enhanced. Meanwhile, contact of the bond pad layer with the solder can be prevented with the cover metal layer.

22 Claims, 10 Drawing Sheets

SURFACE FINISH STRUCTURE OF MULTI-LAYER SUBSTRATE AND MANUFACTURING METHOD THEREOF

BACKGROUND OF THE INVENTION

1. Field of the Invention

The present invention generally relates to a surface finish structure of multi-layer substrate and manufacturing method thereof, and more particularly, to a surface finish structure of a flexible multi-layer substrate and manufacturing method thereof.

2. Description of Prior Art

According to prior arts, a surface finish structure of multi-layer substrate can be categorized into two methods, i.e. Pad Definition and Solder Mask Definition.

Please refer to FIG. 1, which depicts a diagram of surface finish structure in Pad Definition according to prior arts. After a bond pad layer 101 is formed on a dielectric layer, a solder mask 104 is coated. Next, after a hole is made at the position of the bond pad layer 101, a necessary step called "descum" is performed for cleaning the remaining scum. After that, the cover metal layer of nickel 102 and the cover metal layer of gold 103 are formed on the bond pad layer 101.

Please refer to FIG. 2, which depicts a diagram of surface finish structure in Solder Mask Definition according to prior arts. After a bond pad layer 101 is formed on a dielectric layer, a solder mask 104 is coated. Next, after a hole is made at the position of the bond pad layer 101, a necessary step called "descum" is performed for cleaning the remaining scum. After that, the cover metal layer of nickel 102 and the cover metal layer of gold 103 are formed on the bond pad layer 101. The difference between the Solder Mask Definition method and the Pad Definition method shown in FIG. 1 is that the area of the hole in the Pad Definition method is large enough to expose the whole bond pad layer 101 but solder mask 104 covers a portion of the bond pad layer 101 in the Solder Mask Definition method.

In both the Solder Mask Definition method and the Pad Definition method, the cover metal layers must be formed after first coating the solder mask 104 and making the hold. When a device is connected to the bond pad layer 101, which is generally of copper, solder may contact the copper and a wetting phenomenon may occur. The purpose of forming the cover metal layers is to prevent the contact of the bond pad layer 101 with the solder. However, delamination may occur at places of the arrow points shown in FIG. 1 or FIG. 2 due to humidity in the environment, stress between the cover metal layer and the dielectric layer or stress between the cover metal layer and the bond pad layer because they are made of different materials. Accordingly, the solder may contact with the bond pad layer 101 and then fragile IMC (Intermatallic Compound Layer) may appear to cause the contact point to be weakened and thus low down the reliability of the production made by the multi-layer substrate.

Moreover, regardless of the method is either the Solder Mask Definition method or the Pad Definition method, the bond pad layer 101 is formed on the dielectric surface, therefore, bond pad layer 101 may have chance to peel or delaminate from the dielectric layer. Accordingly, package reliability may become lowered.

Therefore, preventing contact of the bond pad layer with solder when the package is processed and enhancing the bond pad layer adhered to the dielectric layer below can raise reliability of package and the yield of the packaged production.

SUMMARY OF THE INVENTION

An objective of the present invention is to provide a surface finish structure of multi-layer substrate and manufacturing method thereof to prevent peeling or delamination of a bond pad layer by embedding the bond pad layer in a dielectric layer, therefore, to raise reliability of package of the multi-layer substrate.

Another objective of the present invention is to provide a surface finish structure of multi-layer substrate and manufacturing method thereof to form at least one cover metal layer before coating a solder mask to prevent contact of the bond pad layer with solder when the package is processed to raise reliability of package of the multi-layer substrate.

The surface finish structure of the present invention comprises a bond pad layer, at least one cover metal layer and a solder mask. The bond pad layer is embedded in a dielectric layer of the multi-layer substrate. The cover metal layer covers the bond pad layer. The solder mask has a hole to expose the cover metal layer. The present invention forms the cover metal layer to cover the bond pad layer and then forms the solder mask thereafter, making the hole to the solder mask at the position of the cover metal layer to expose thereof.

The present invention can also form the bond pad layer on a surface of the dielectric layer at the same time but still coat the solder mask after forming the cover metal layer. Thereafter, the present invention can make the hole to the solder mask at the position of the cover metal layer to expose thereof.

The present invention also provides a method of manufacturing a surface finish structure of a multi-layer substrate. The manufacturing method comprises steps below:

forming at least one cover metal layer on a surface of a bond pad layer and the cover metal layer covers the bond pad layer completely;

coating a solder mask on one surface of the multi-layer substrate having the bond pad layer; and making a hole to the solder mask at a position of the cover metal layer to expose thereof. The bond pad layer can be embedded in a dielectric layer of the multi-layer substrate. Alternatively, the bond pad layer can also be formed on a surface of the dielectric layer.

By embedding the bond pad layer in the dielectric layer, the surface finish structure of the present invention can enhance adhesion intensity between the bond pad layer and the dielectric layer to prevent the peeling or the delamination of the bond pad layer from the dielectric layer, therefore, the bond pad layer can be more reliable. Because at least one cover metal layer is formed as a "barrier layer" for the bond pad layer and the solder before coating the solder mask, even occurrence of delamination due to humidity in the environment, stress between the cover metal layer and the dielectric layer or stress between the cover metal layer and the bond pad layer may exist, the present invention can still prevent contact of the bond pad layer with the solder to raise the reliability and yield to the multi-layer substrate.

DETAILED DESCRIPTION OF THE INVENTION

Figure 3:
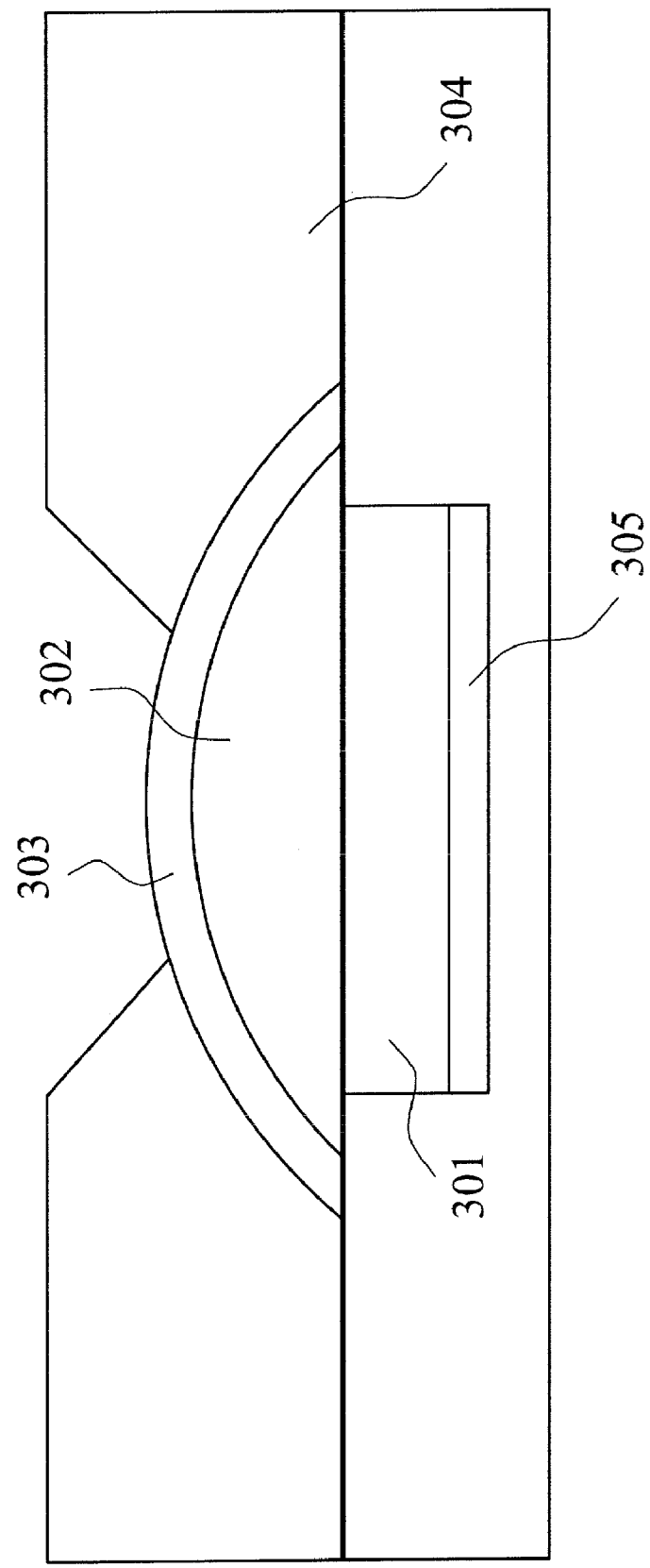
FIG. 3 depicts a diagram of surface finish structure according to a first embodiment of the present invention.

Please refer to FIG. 3, which depicts a diagram of surface finish structure according to a first embodiment of the present invention. A bond pad layer 301 of the first embodiment is embedded in a dielectric layer and the dielectric layer material can be polyimide. Moreover, at least one cover metal layer, i.e. the cover metal layer of nickel 302 and the cover metal layer of gold 303 are formed on the bond pad layer 301 and then a solder mask 304 is coated in the first embodiment. Then, a hole is made to the solder mask 304 at the position of the cover metal layer of gold 303 to expose the cover metal layer of gold 303. The solder mask 304 covers a portion of the cover metal layer of gold 303 as shown in FIG. 3.

By embedding the bond pad layer 301 in the dielectric layer, adhesion intensity between the bond pad layer 301 and the dielectric layer is enhanced to prevent delamination of the bond pad layer 301 from the dielectric layer happening to raise the reliability of the bond pad layer 301. Meanwhile, by using the Solder Mask Definition method, covering a portion of the cover metal layer of gold 303 with the solder mask 304 ensures that the delamination of the cover metal layer of nickel 302 and the cover metal layer of gold 303 due to humidity in the environment or due to stress will not happen easily. Even aforesaid delamination from the solder mask 304 or from the bond pad layer 301 does occur, the cover metal layer of nickel 302 and the cover metal layer of gold 303 still can prevent the contact of the bond pad layer with the solder. Accordingly, the reliability of the multi-layer substrate can be raised.

Figure 4:
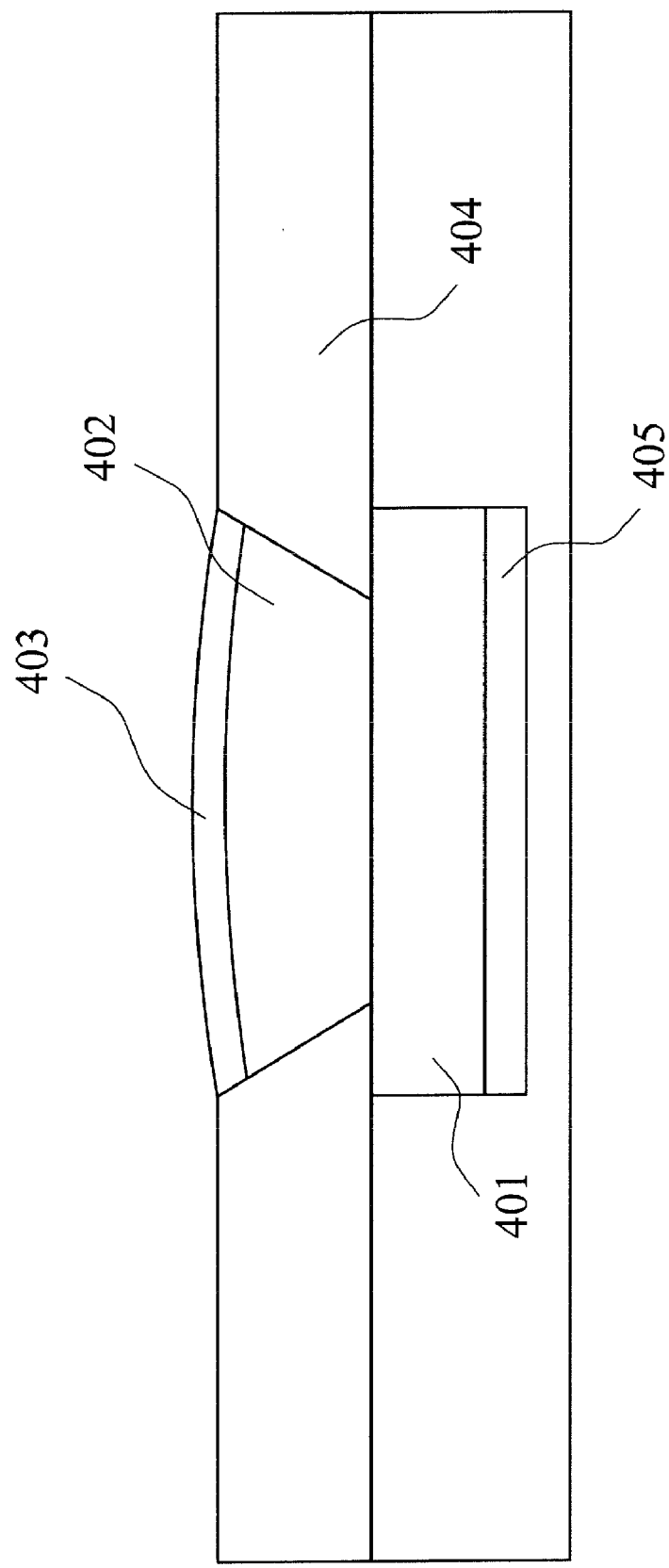
FIG. 4 depicts a diagram of surface finish structure according to a second embodiment of the present invention.

Please refer to FIG. 4, which depicts a diagram of surface finish structure according to a second embodiment of the present invention. Same as the first embodiment, a bond pad layer 401 of the second embodiment is embedded in a dielectric layer and is manufactured in a Solder Mask Definition method. After a solder mask 404 is coated, a hole is made to the solder mask 404 at the position of the bond pad layer 401 to expose thereof. The solder mask 404 covers a portion of the bond pad layer 401. Then, at least one cover metal layer, i.e. the cover metal layer of nickel 402 and the cover metal layer of gold 403 are formed on the bond pad layer 401.

Figure 2:
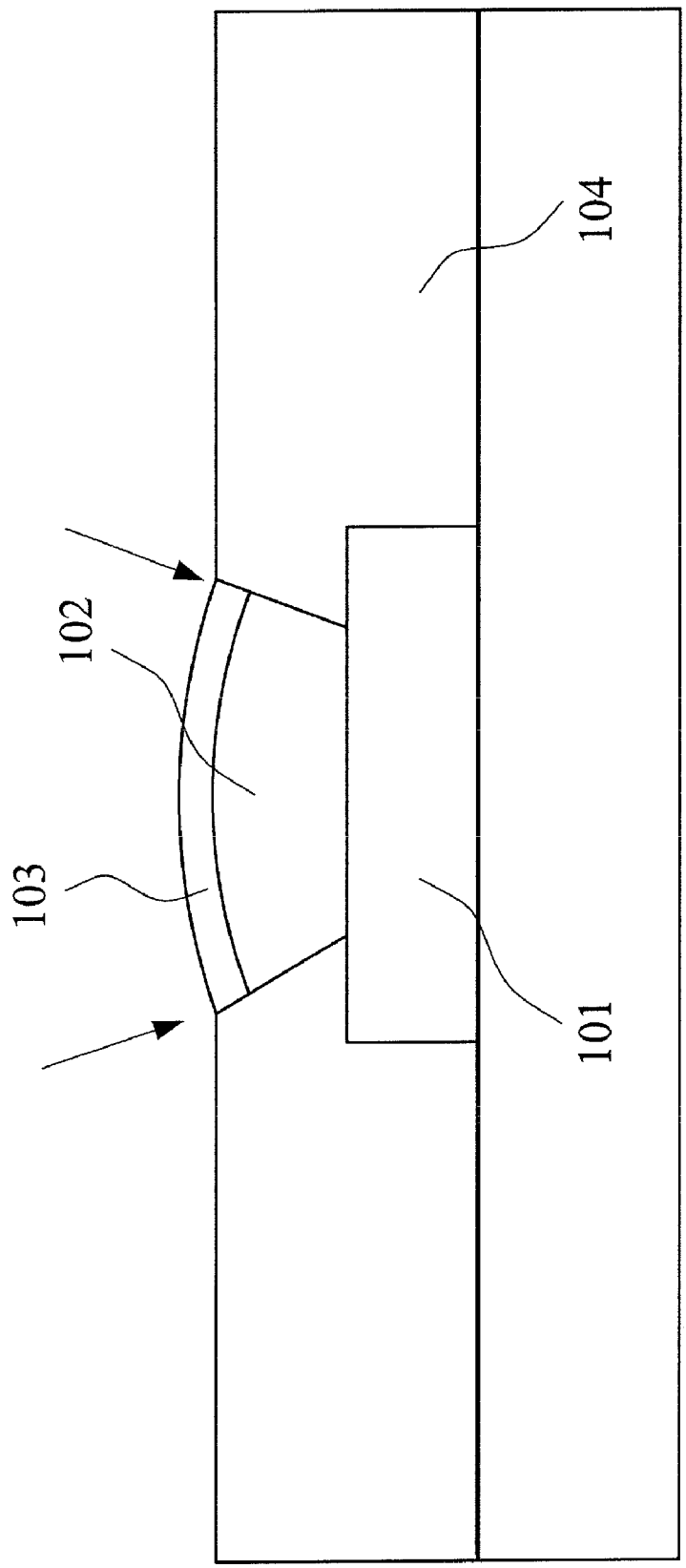
FIG. 2 depicts a diagram of surface finish structure in Solder Mask Definition according to prior arts.

The difference from the prior art shown in FIG. 2 is that the bond pad layer 401 is embedded in the dielectric layer to enhance adhesion intensity between the bond pad layer 401 and the dielectric layer. Therefore, delamination of the bond pad layer 401 from the dielectric layer will not happen easily and the reliability of the bond pad layer 401 is raised.

Figure 5:
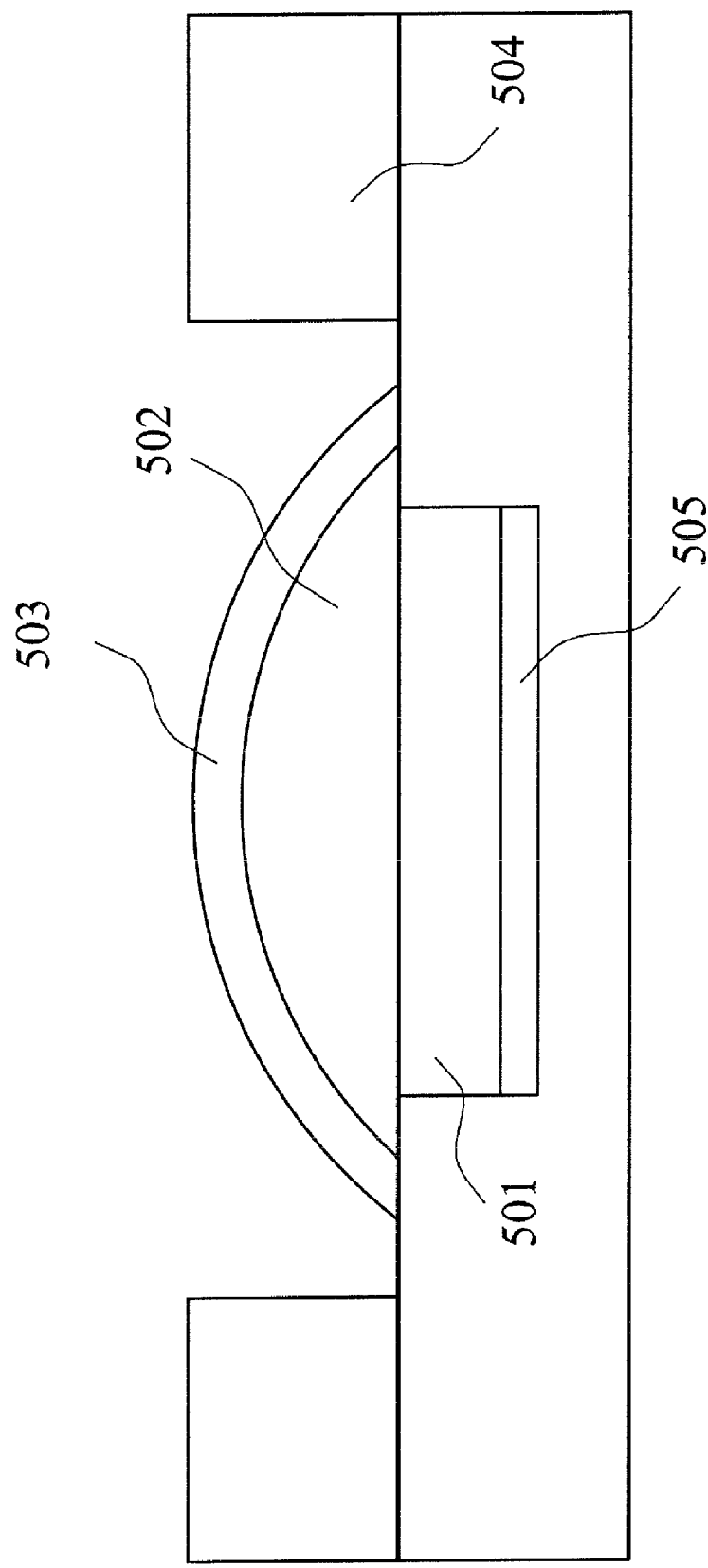
FIG. 5 depicts a diagram of surface finish structure according to a third embodiment of the present invention.

Please refer to FIG. 5, which depicts a diagram of surface finish structure according to a third embodiment of the present invention. Same as the first embodiment, a bond pad layer 501 of the second embodiment is embedded in a dielectric layer and is manufactured in a Pad Definition method. Therefore, the present invention can form at least one cover metal layer, i.e. the cover metal layer of nickel 502 and the cover metal layer of gold 503 on the bond pad layer 501 and a solder mask 504 is coated. Then, a hole is made to the solder mask 504 at the position of the cover metal layer of gold 503 to expose thereof. Moreover, the area of the hole includes the cover metal layer of gold 503 completely (more definitely includes the bond pad layer 501). Alternatively, in the third embodiment, the solder mask 504 can also be coated and the cover metal layer of nickel 502 and the cover metal layer of gold 503 can be formed after the hole is made to the solder mask 504 at the position of the bond pad layer 501.

Figure 1:
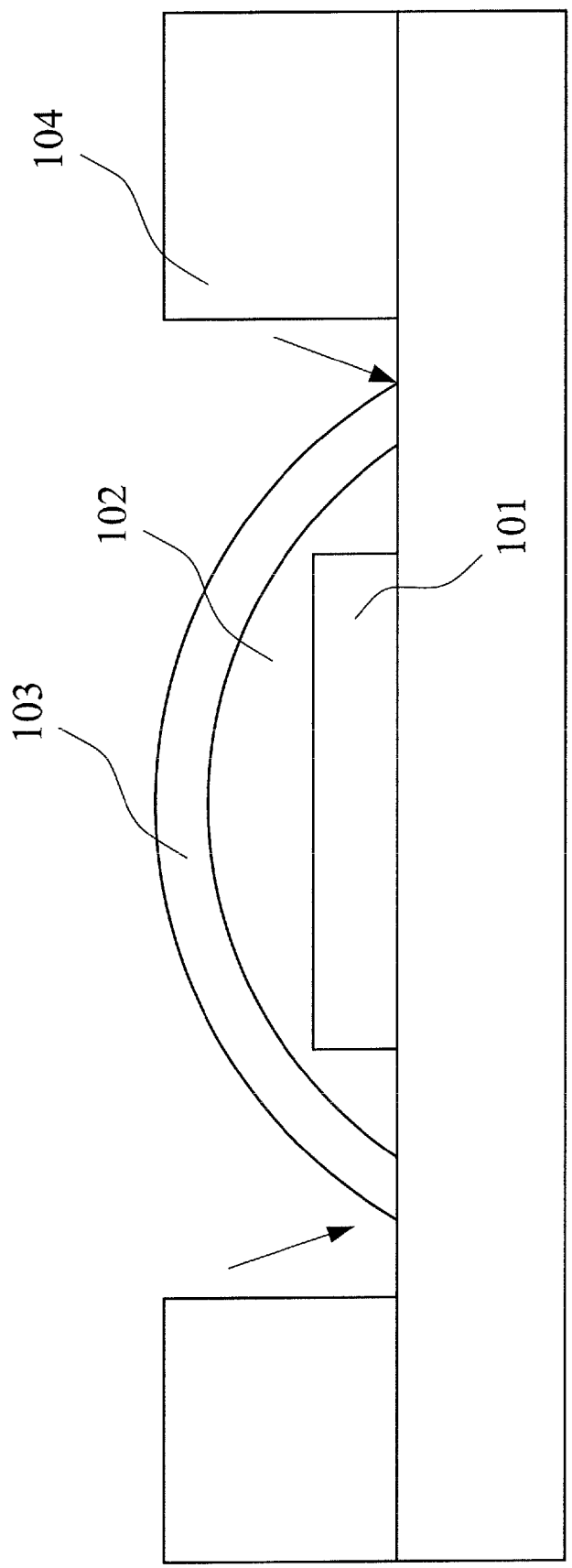
FIG. 1 depicts a diagram of surface finish structure in Pad Definition according to prior arts.

The difference from the prior art shown in FIG. 1 is that the bond pad layer 501 is embedded in the dielectric layer to enhance adhesion intensity between the bond pad layer 501 and the dielectric layer. Therefore, delamination of the bond pad layer 501 from the dielectric layer will not happen easily and raise reliability of the bond pad layer 501.

Figure 6:
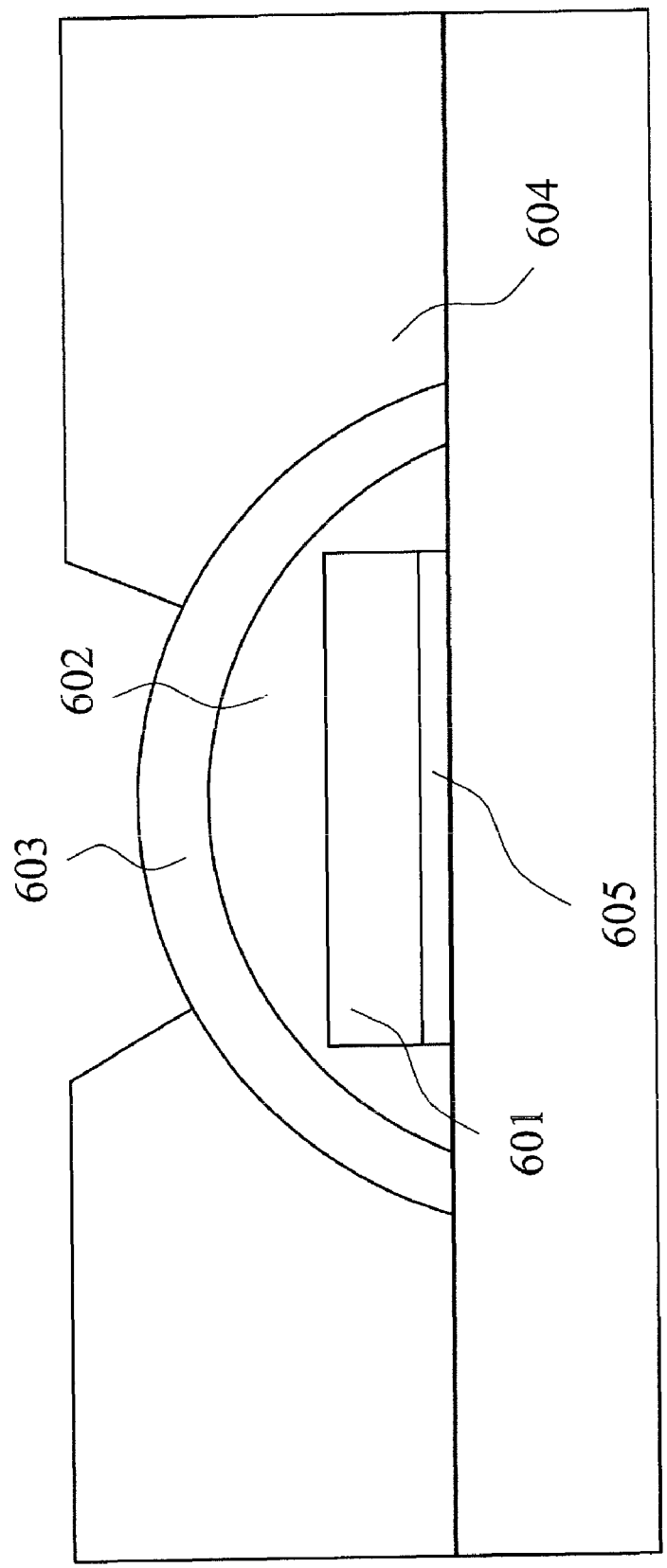
FIG. 6 depicts a diagram of surface finish structure according to a fourth embodiment of the present invention.

Please refer to FIG. 6, which depicts a diagram of surface finish structure according to a fourth embodiment of the present invention. A bond pad layer 601 is formed on a dielectric layer surface. In the fourth embodiment, the present invention forms at least one cover metal layer, i.e. the cover metal layer of nickel 602 and the cover metal layer of gold 603 on the bond pad layer 601. Then, the present invention coats a solder mask 604 on the cover metal layer of gold 603 and dielectric layer. After a hole is made to the solder mask 604 at the position of the cover metal layer of gold 603 to expose the cover metal layer of gold 603, the solder mask 604 covers a portion of the cover metal layer of nickel 602 and the cover metal layer of gold 603.

Because the solder mask 604 still covers a portion of aforesaid cover metal layers, even delamination of the cover metal layer of nickel 602 and the cover metal layer of gold 603 from the solder mask 304 or from the bond pad layer 301 occurs, they still can prevent the contact of the bond pad layer with the solder. Accordingly, the reliability of the bond pad layer 601 and the multi-layer substrate can be raised.

Figure 7A:
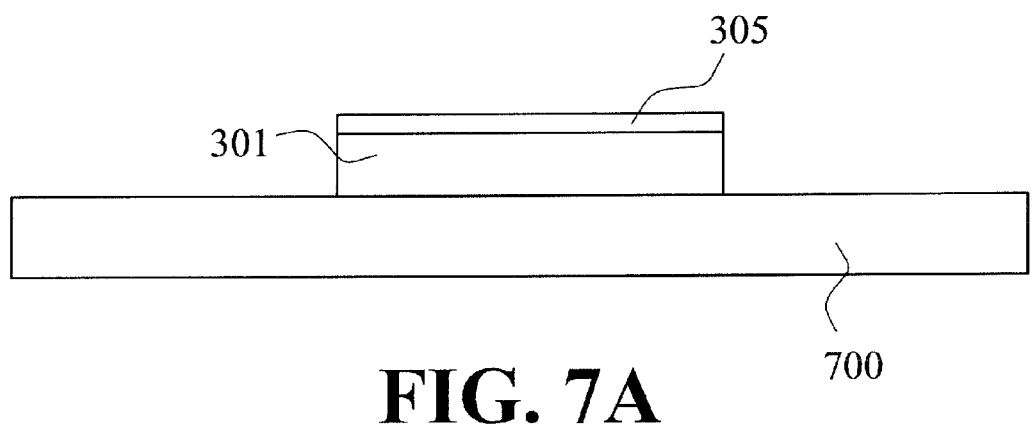
FIG. 7A to FIG. 7E depict a structural flow chart of a manufacturing method according to the first embodiment of the present invention.
Figure 7B:
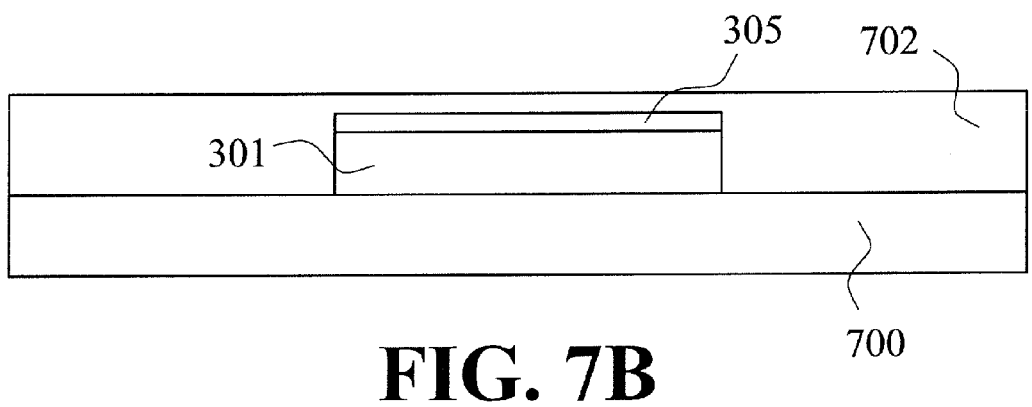
Figure 7C:
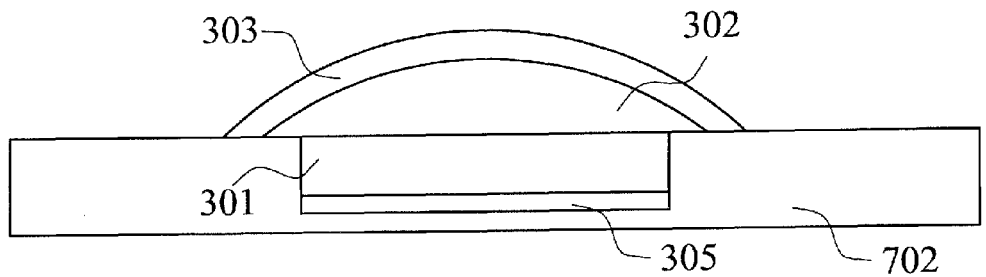
Figure 7D:
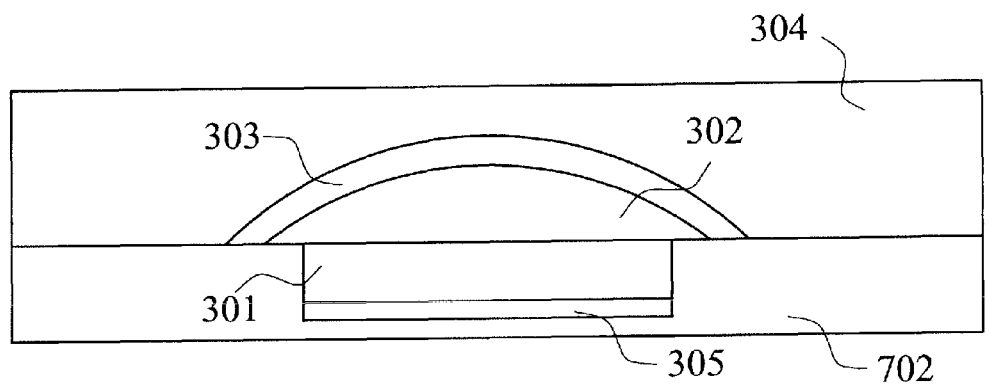

Please refer to FIG. 7A to FIG. 7E, which depict a structural flow chart of a manufacturing method according to the first embodiment of the present invention. FIG. 7A shows steps of forming a bond pad layer 301 on a surface of a carrier 700 and implementing an interface adhesion enhancing process 305, such as, an oxygen or argon plasma process. FIG. 7B shows a step of forming a dielectric layer 702 to cover the carrier 700 completely. FIG. 7C shows steps of separating the bond pad layer 301 and the dielectric layer 702 from the carrier surface. After turning to upside down, the cover metal layer of nickel 302 and the cover metal layer of gold 303 are formed on the bond pad layer 301 to cover thereof. FIG. 7D shows a step of coating a solder mask 304 to cover the cover metal layer of nickel 302 and the cover metal layer of gold 303 completely.

Figure 7E:
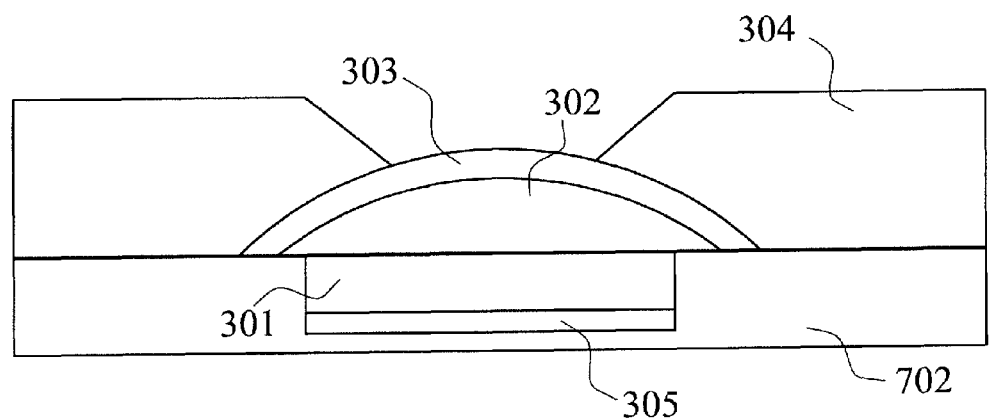

FIG. 7E shows a step of making a hole to the solder mask 304 at a position of the cover metal layer of gold 303 to be exposed thereof. The solder mask 304 covers a portion of the cover metal layer of gold 303 to realize a surface finish structure of embedding the bond pad layer 301 in the dielectric layer 702 and covering a portion of the cover metal layer of gold 303 with the solder mask 304. Mentioned prior regarding the third embodiment as shown in FIG. 5, the present invention can also form the bond pad layer 501 in the same way by controlling the area of the hole to include the bond pad layer 301 during the step of making the hole shown in FIG. 7E. If the bond pad layer 401 of the second embodiment shown in FIG. 4 is desired, the present invention can switch the step shown in FIG. 7C and the step shown in FIG. 7D, i.e. forming the solder mask 304 and making the hole to cover a portion of the bond pad layer 301 with the solder mask 304 and then the cover metal layer of nickel 302 and the cover metal layer of gold 303 are formed.

Figure 8A:
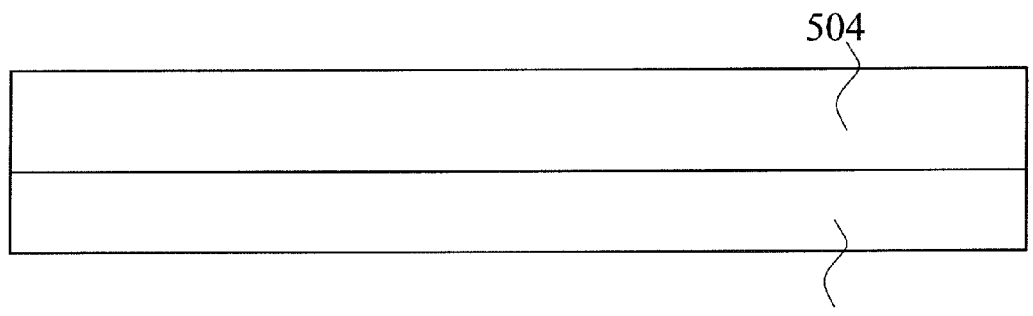
FIG. 8A to FIG. 8E depict a structural flow chart of a manufacturing method according to the third embodiment of the present invention.
Figure 8B:
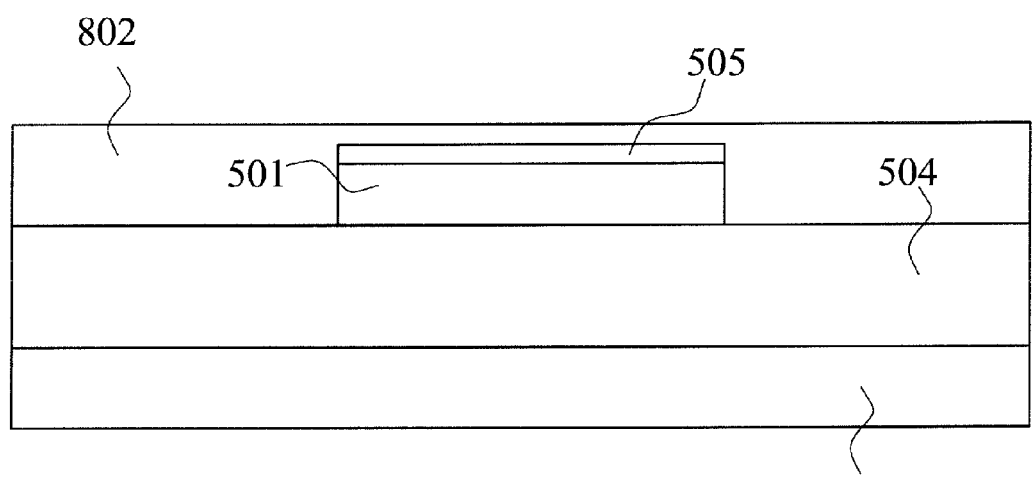
Figure 8C:
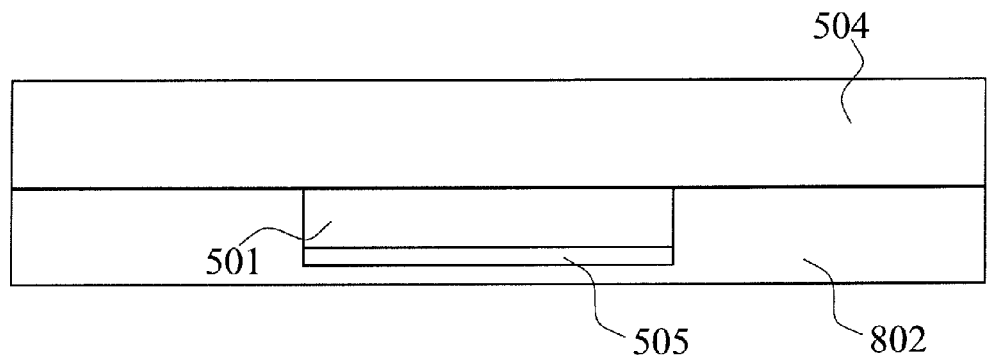

Please refer to FIG. 8A to FIG. 8E, which depict a structural flow chart of a manufacturing method according to the third embodiment of the present invention. FIG. 8A shows a step of forming a solder mask 504 on a surface of a carrier 800. FIG. 8B shows steps of forming a bond pad layer 501 on the solder mask 504 and forming a dielectric layer 802 thereon. Similarly, an interface adhesion enhancing process 505 can be implemented between the bond pad layer 501 and the dielectric layer 802, such as, an oxygen or argon plasma process. FIG. 8C shows steps of separating the solder mask 504 from the carrier 800 surface and turning the dielectric layer 802 upside down.

Figure 8D:
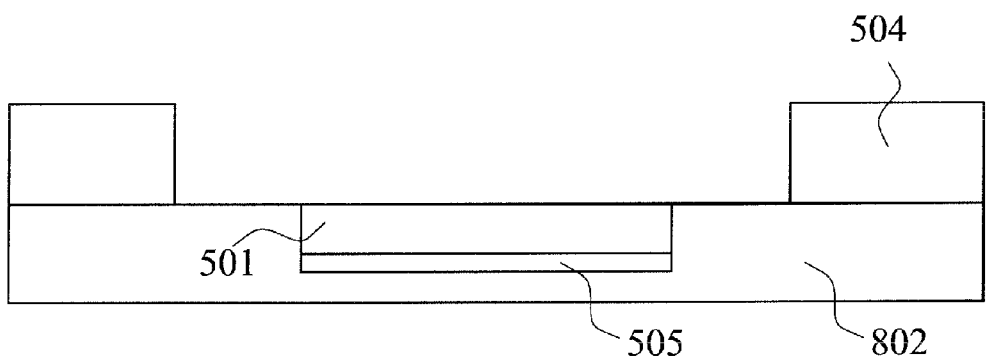
Figure 8E:
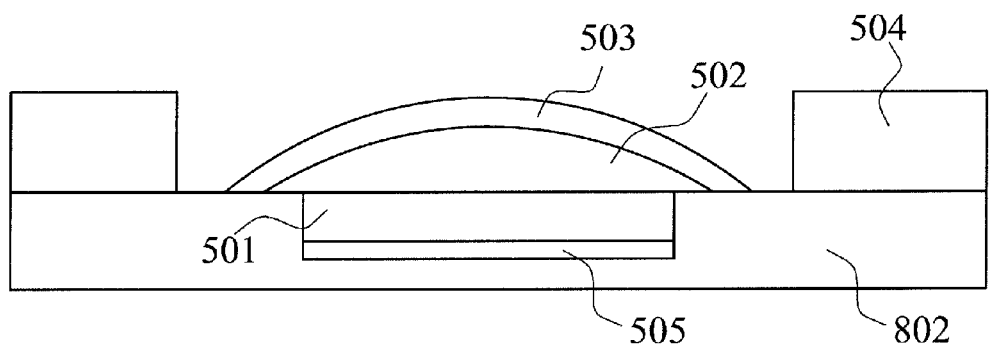

FIG. 8D shows a step of making a hole to the solder mask 504 at the position of the bond pad layer 501 which is embedded in the dielectric layer 802 to expose the bond pad layer 501. Furthermore, the area of the hole includes the whole area of the bond pad layer 501 completely. FIG. 8E shows a step of forming a cover metal layer of nickel 502 and a cover metal layer of gold 503 on the bond pad layer 501 to cover it thereon. Accordingly, a surface finish structure of embedding the bond pad layer 501 in the dielectric layer 802 can be realized. Mentioning about the second embodiment shown in FIG. 4, the present invention can also form the bond pad layer 401 in the same way by covering a portion of the bond pad layer 501 with the solder mask 504 during the step of making the hole shown in FIG. 8D.

Furthermore, in all embodiments of the present invention, interface adhesion enhancing processes marked with 305, 405, 505 and 605 in respective figures can be implemented between the bond pad layers 301, 401, 501 and 601 and the dielectric layers to increase adhesion intensity therebetween. Then, peeling or delamination of the bond pad layers 301, 401, 501 and 601 can be prevented better.

In conclusion, the present invention employs a carrier to manufacture the bond pad layer embedded in the dielectric layer to increase the adhesive fore of the bond pad layer to the dielectric layer for preventing peeling or delamination of the bond pad layer and raising the reliability thereof. Meanwhile, the cover metal layers are formed before the solder mask and cover a portion of the cover metal layers with the solder mask to ensure that the delamination of the cover metal layers due to humidity in the environment or stress will not happen. The cover metal layers still can prevent the contact of the bond pad layer with the solder, even delamination of the cover metal layers from the solder mask or from the bond pad layer occurs, therefore, the reliability of the bond pad layer can guaranteed and the reliability of the multi-layer substrate and the yield of the productions made thereby can also be raised, accordingly.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A surface finish structure of a multi-layer substrate, comprising:
    a bond pad layer, embedded in a dielectric layer, wherein there is no height difference between adjacent lateral edges of the bond pad layer and the dielectric layer;
    at least one cover metal layer, covering the bond pad layer; and
    a solder mask, having a hole to expose the cover metal layer, wherein the solder mask covers a portion of the cover metal layer.

2. The surface finish structure of claim 1, wherein a material of the dielectric layer is polyimide.

3. The surface finish structure of claim 1, wherein a material of the bond pad layer is copper.

4. The surface finish structure of claim 1, wherein a material of the cover metal layer is nickel.

5. The surface finish structure of claim 1, wherein a material of the cover metal layer is gold.

6. The surface finish structure of claim 1, wherein an interface adhesion enhancing process is implemented between the dielectric layer and the bond pad layer to increase adhesion intensity therebetween.

7. A surface finish structure of a multi-layer substrate, comprising:
    a bond pad layer, embedded in a dielectric layer, wherein there is no height difference between adjacent lateral edges of the bond pad layer and the dielectric layer;
    at least one cover metal layer, covering the bond pad layer; and
    a solder mask, covering a portion of the cover metal layer.

8. The surface finish structure of claim 7, wherein an interface adhesion enhancing process is implemented between the dielectric layer and the bond pad layer to increase adhesion intensity therebetween.

9. The surface finish structure of claim 7, wherein a material of the dielectric layer is polyimide.

10. The surface finish structure of claim 7, wherein a material of the bond pad layer is copper.

11. The surface finish structure of claim 7, wherein a material of the cover metal layer is nickel.

12. The surface finish structure of claim 7, wherein a material of the cover metal layer is gold.

13. A method of manufacturing a surface finish structure of a multi-layer substrate, comprising steps of:
    forming a bond pad layer on a carrier surface and forming a dielectric layer, and then separating the bond pad layer and the dielectric layer from the carrier surface to embed the bond pad layer into the dielectric layer;
    forming at least one cover metal layer on a surface of the bond pad layer and the cover metal layer covers the bond pad layer completely;
    coating a solder mask on one surface of the multi-layer substrate having the bond pad layer; and
    making a hole to the solder mask at a position of the cover metal layer to expose thereof.

14. The manufacturing method of claim 13, wherein the solder mask covers a portion of the cover metal layer.

15. The manufacturing method of claim 13, wherein an area of the hole comprises a whole area of the cover metal layer.

16. A method of manufacturing a surface finish structure of a multi-layer substrate, comprising steps of:
    coating a solder mask;
    making a hole to the solder mask at a position of a bond pad layer embedded in a surface of a dielectric layer of the multi-layer substrate, wherein there is no height difference between adjacent lateral edges of the bond pad layer and the dielectric layer; and
    forming at least one cover metal layer on a surface of the bond pad layer to cover the bond pad layer.

17. The manufacturing method of claim 16, wherein the solder mask covers a portion of the bond pad layer.

18. The manufacturing method of claim 16, wherein an area of the hole comprises a whole area of the bond pad layer.

19. The manufacturing method of claim 16, further comprising steps of forming the bond pad layer on a carrier surface and forming the dielectric layer, and then separating the bond pad layer and the dielectric layer from the carrier surface to embed the bond pad layer into the dielectric layer before the step of coating the solder mask.

20. The manufacturing method of claim 16, wherein the solder mask is formed on a carrier surface.

21. The manufacturing method of claim 20, further comprising steps of forming the bond pad layer on the solder mask and forming the dielectric layer to embed the bond pad layer into the dielectric layer after the step of forming the solder mask.

22. The manufacturing method of claim 20, further comprising a step of separating the solder mask from the carrier surface before the step of making the hole to the solder mask.

* * * * *